United States Patent
Sakamoto et al.

(10) Patent No.: US 7,095,172 B2
(45) Date of Patent: Aug. 22, 2006

(54) ORGANIC ELECTRO LUMINESCENCE DISPLAY AND ITS MANUFACTURE METHOD

(75) Inventors: Yoshiaki Sakamoto, Kawasaki (JP); Kiyoshi Ozawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/125,104

(22) Filed: May 10, 2005

(65) Prior Publication Data

US 2005/0214577 A1  Sep. 29, 2005

Related U.S. Application Data

(63) Continuation of application No. PCT/JP03/03197, filed on Mar. 17, 2003.

(51) Int. Cl.
*H01J 1/62* (2006.01)

(52) U.S. Cl. .................. 313/506; 313/509; 313/512

(58) Field of Classification Search ............ 313/498, 313/506, 509, 512, 292
See application file for complete search history.

(56) References Cited

U.S. PATENT DOCUMENTS

| | | | |
|---|---|---|---|
| 5,701,055 A | 12/1997 | Nagayama et al. | |
| 5,952,037 A | 9/1999 | Nagayama et al. | |
| 6,037,712 A * | 3/2000 | Codama et al. | 313/498 |
| 6,137,220 A | 10/2000 | Nagayama et al. | |
| 6,339,288 B1 * | 1/2002 | Qian et al. | 313/498 |
| 6,351,066 B1 | 2/2002 | Gyoutoku et al. | |

FOREIGN PATENT DOCUMENTS

| | | |
|---|---|---|
| JP | 8-315981 | 11/1996 |
| JP | 10-106747 | 4/1998 |
| JP | 10-312886 | 11/1998 |
| JP | 11-40354 | 2/1999 |
| JP | 11-121168 | 4/1999 |
| JP | 2001-93666 | 4/2001 |
| JP | 2001-126865 | 5/2001 |
| JP | 2001-185351 | 7/2001 |

* cited by examiner

*Primary Examiner*—Vip Patel
(74) *Attorney, Agent, or Firm*—Westerman, Hattori, Daniels & Adrian, LLP.

(57) ABSTRACT

A plurality of pixel areas are defined on the surface of a substrate. A partition wall is disposed on the surface of the substrate in an area between adjacent pixel areas. The partition wall comprises a lower portion made of inorganic insulating material and an upper portion made of insulating material having etching characteristics different from the etching characteristics of the lower portion and disposed on the lower portion. The upper portion protrudes from the side walls of the lower portion toward the pixel areas. Lower electrodes are formed on the pixel areas. Organic layers are disposed on the lower electrodes and contains organic luminescence material which emits light upon current injection. Upper electrodes are disposed on the organic layers.

5 Claims, 11 Drawing Sheets

ORGANIC ELECTRO LUMINESCENCE DISPLAY AND ITS MANUFACTURE METHOD

CROSS REFERENCE TO RELATED APPLICATION

This application is a continuation application of International Application No. PCT/JP03/03197 filed on Mar. 17, 2003, the entire contents of which are incorporated herein by reference.

TECHNICAL FIELD

The present invention relates to an organic electro luminescence (EL) display and its manufacture method, and more particularly to an organic EL display having a plurality of pixels and partition walls formed between pixels, and its manufacture method.

BACKGROUND ART

An organic EL device has the structure that a multilayer of a plurality of organic compound layers having carrier transportation and luminescence ability is sandwiched between a pair of electrodes. In such a diode structure, it is preferable to make uniform the thickness of the organic compound layer. If the thickness is not uniform, current flowing through the organic compound layer in a thickness direction becomes irregular in-plane. Decomposition of the organic compound layer is locally accelerated through exothermic, and the device lifetime is shortened.

Organic compound is soluble to organic solvent, and is deteriorated by moisture. After an organic compound layer is formed, it is therefore difficult to pattern it through photolithography. To avoid this, a shadow mask made of metal and having openings corresponding to the pixel shape and layout is used to divide an organic compound layer into pixel units. In order to allow color display, position alignment of the shadow mask is required to be performed three times corresponding to RGB. If there is an error of shadow mask position alignment, the distances between pixels become irregular and the thicknesses of organic compounds become not uniform.

The patent document 1 indicated below discloses the invention related to prevention of irregularity of distances between pixels.

FIG. 11 is a cross sectional view of an organic EL display disclosed in the patent document 1. On the surface of a substrate 100, lower electrodes 101 extending in a lateral direction in FIG. 11 are formed. A plurality of insulating films 102 extending in a direction perpendicular to the drawing sheet are formed on the surface of the substrate 100, and partition walls 103 are formed on the insulating films 102. An area of the lower electrode 101 between two adjacent partition walls 103 defines a pixel area.

The partition wall 103 is made of photosensitive resin and has an inverse taper shape broadening its width as the position becomes farther from the substrate 100. An organic compound layer 104 and an upper electrode 105 are stacked on the lower electrode 101 in each pixel area. An organic compound layer 104a and a conductive layer 105a are also formed on the partition wall 103, which are deposited when the organic compound layer 104 and upper electrode 105 are deposited.

The position of each pixel in the lateral direction in FIG. 11 is defined by the partition walls 103, and the position of each pixel in the direction perpendicular to the drawing sheet is defined by the lower electrodes 101. Therefore, the distances between pixels do not become irregular even if there is position misalignment of a shadow mask to be used when depositing an organic compound layer.

The region near the border of the organic compound layer 104 becomes thinner than the central region. If a diode is formed to the region having a thin film thickness, current is concentrated on this region. In the conventional example shown in FIG. 11, the insulating film 102 is interposed between the lower electrode 101 and the region near the border of the organic compound layer 104 to prevent current concentration on the thin region.

In this conventional example, the partition wall 103 is made of photosensitive resin. The partition wall 103 made of photosensitive resin is likely to adsorb molecules in an atmosphere. Molecules adsorbed to the partition wall 103 are gradually emitted from the partition wall 103 and affect the organic compound layer 104, accelerating deterioration of the organic compound layer 104.

If high temperature treatment is performed after the partition wall 103 is formed, molecules adsorbed to or occluded in the partition wall 103 can be emitted. However, since the partition wall 103 has an unstable inverse taper cross section, its shape is largely deformed if heat treatment is performed at a glass transition temperature or higher. Heat treatment at a sufficient high temperature is therefore impossible.

An object of this invention is to provide an organic EL display whose organic compound layers are hard to be deteriorated, and its manufacture method.

DISCLOSURE OF INVENTION

According to one aspect of the present invention, there is provided an organic EL display comprising: a substrate with a plurality of pixel areas being defined on a surface of the substrate; a partition wall disposed on the surface of the substrate in an area between adjacent pixel areas, the partition wall including a lower portion made of inorganic insulating material and an upper portion made of insulating material having etching characteristics different from etching characteristics of the lower portion and disposed on the lower portion, the upper portion protruding from side walls of the lower portion toward the pixel areas; a lower electrode formed on the pixel area; an organic layer disposed on the lower electrode and containing organic luminescence material which emits light upon current injection; and an upper electrode disposed on the organic layer.

Since the lower portion of the partition wall is made of inorganic insulating material, moisture and adsorbed gas can be removed easily through heating and the partition wall is hard to be deformed.

According to another aspect of the present invention, there is provided a manufacture method for an organic EL display comprising steps of: forming a plurality of lower electrodes each made of a conductive film on a substrate, the lower electrode extending in a row direction; forming a first film made of inorganic insulating film on the substrate, the first film covering the lower electrodes; forming a second film on the first film, the second film being made of insulating material different from the inorganic insulating material of the first film; patterning the second film to leave a plurality of upper patterns extending in a column direction; etching the first film to leave lower patterns of the first film by using the upper patterns as an etching mask, and at the same time laterally etching the first film to form a protruded portion of the upper pattern protruding from side walls of the lower pattern; forming an organic layer on the substrate by depositing organic luminescence material under a condition that the organic luminescence material twists also in an area shaded by the protruded portion; and forming an upper electrode on the organic layer by depositing conductive material under a condition that the conductive material does not twists in the area shaded by the protruded portion or under a condition that a twist amount of the conductive material becomes smaller than a twist amount when the organic layer is formed.

The lower portion of the partition wall is made of the first film of inorganic insulating film. It is therefore possible to prevent emission of moisture and adsorbed gas from the lower portion of the partition wall. Since the upper electrode does not enter the shade of the protruded portion, it is possible to prevent the upper electrode from being formed near the border of the organic layer. The area where the upper electrode is formed can be limited to an area where the thickness of the organic layer is generally uniform.

If the second film is made of organic substance, it is preferable to perform heat treatment after the second film is patterned.

BEST MODE FOR CARRYING OUT THE INVENTION

Figure 1:
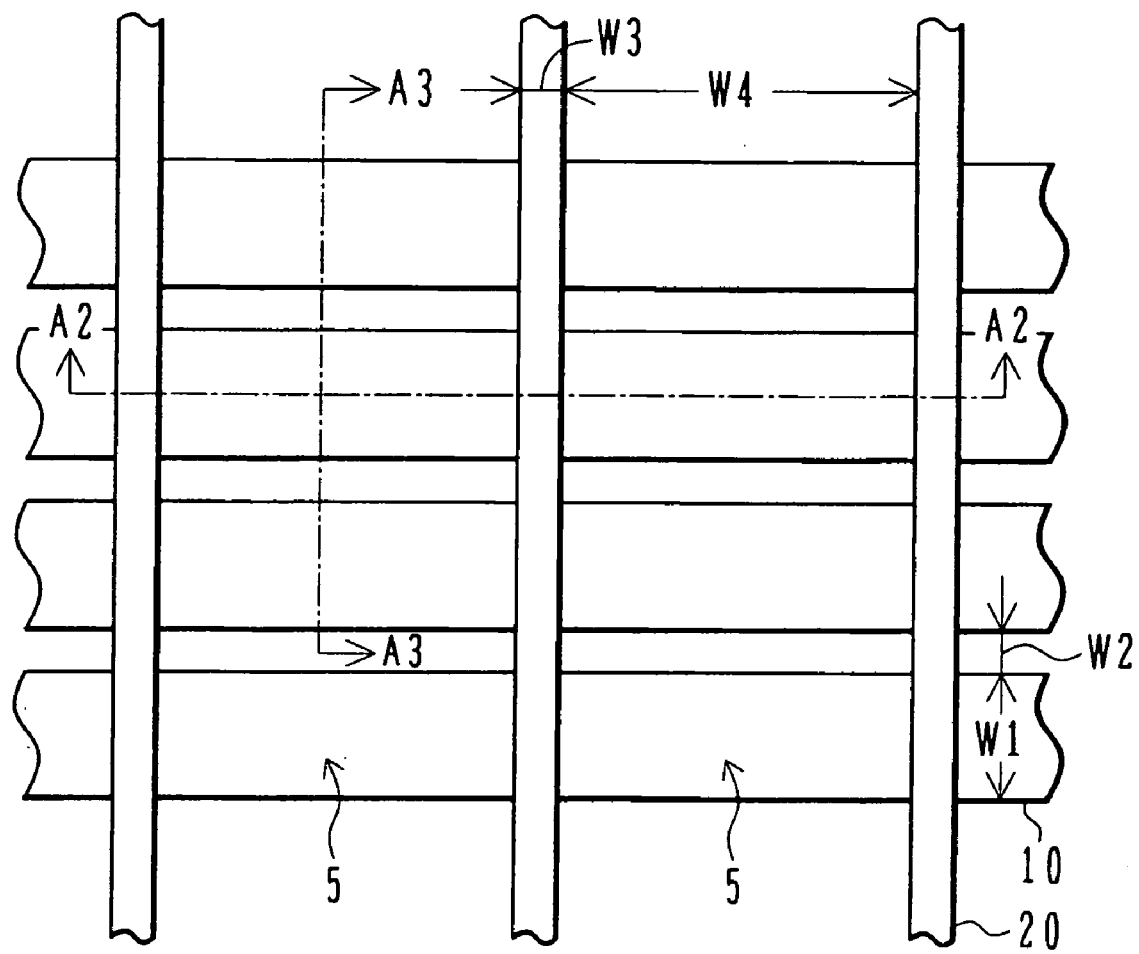
FIG. 1 is a schematic plan view of an organic EL display according to a first embodiment.

FIG. 1 is a schematic plane view of an organic EL display according to the first embodiment of the present invention. On a glass substrate, a plurality of lower electrodes 10 are disposed extending in the lateral direction (row direction) in FIG. 1. The lower electrode 10 is made of indium tin oxide (ITO) and has a width W1 of 100 μm. A width W2 between adjacent two lower electrodes 10 is 20 μm.

A plurality of partition walls 20 are disposed on the glass substrate and lower electrodes 10, extending in a vertical direction (column direction) in FIG. 1. The partition wall 20 has a width W3 of 40 μm, and a width W4 between adjacent two partition walls 20 is 320 μm. The region between adjacent partition walls 20 in each lower electrode 10 defines one pixel area 5.

Figure 2A:
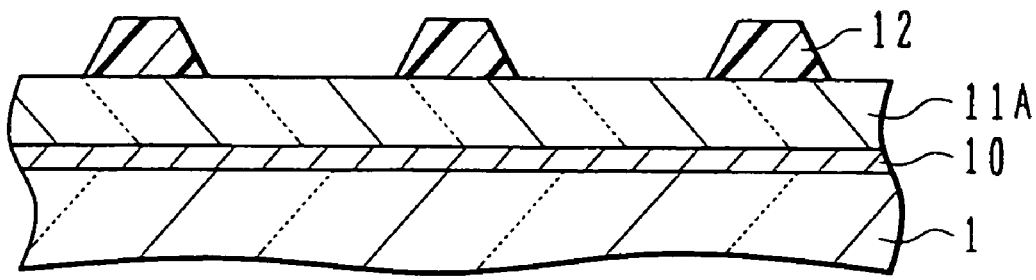
FIGS. 2A and 2B are cross sectional views of a substrate illustrating a manufacture method for the organic EL display of the first embodiment.

With reference to FIGS. 2A to FIG. 5, description will be made on a manufacture method for the organic EL display of the first embodiment. FIGS. 2A to 2C correspond to cross sectional views taken along one-dot chain line A2—A2 in FIG. 1, and FIG. 3A corresponds to a cross sectional view taken along one-dot chain line A3—A3 in FIG. 1.

As shown in FIG. 2A, the lower electrode 10 of ITO is formed on the glass substrate 1. The lower electrode 10 is formed by depositing an ITO film to a thickness of 150 nm through sputtering and patterning the ITO film by isotropic etching.

A silicon nitride 11A is deposited to a thickness of 400 nm by plasma enhanced chemical vapor deposition (PECVD) on the glass substrate 1, covering the lower electrode 10. Positive type resist is coated on the surface of the silicon nitride film 11A to form a resist film. The resist film is exposed and developed to form a pattern corresponding to the partition walls 20 shown in FIG. 1. The patterned resist film is subjected to heat treatment at a glass transition temperature or higher to form an upper partition wall 12. The cross sectional shape of the resist pattern has a normal taper shape having a broader bottom surface than a top surface. Therefore, as compared with an inverse taper shape, the resist pattern is less deformed by heat treatment.

As the resist pattern is subjected to a heat treatment at a temperature equal to or higher than a glass transition temperature of resist material, it is possible to remove solvent, moisture and the like from the resist pattern, to make the film dense, suppressing occlusion of atmospheric gas, and to improve geometry stability. It is also possible to improve the performance of the resist pattern as an etching mask.

Mixture gas of $CF_4$ and $O_2$ (oxygen density 5%) is introduced into a barrel type plasma etcher, and the silicon nitride film 11A is isotropically etched by using the upper partition wall 12 as an etching mask.

Figure 2B:
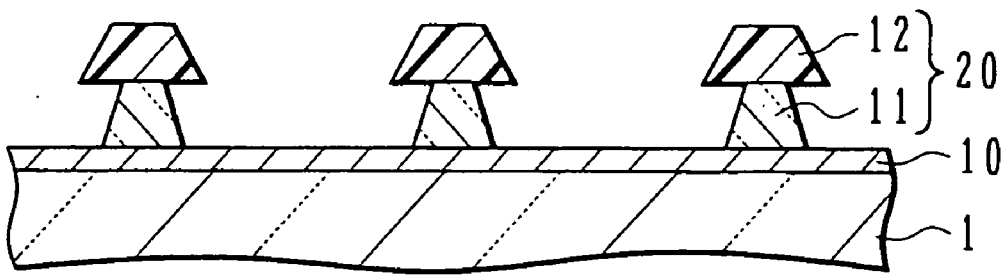

As shown in FIG. 2B, in the area where the upper partition wall 12 is not disposed, the lower electrode 10 is therefore exposed and a lower partition wall 11 made of silicon nitride is left under the upper partition wall 12. The lower partition wall 11 and upper partition wall 12 constitute the partition wall 20. Since the silicon nitride film 11A is isotropically etched, etching proceeds also in the lateral direction. As a result, the cross sectional shape of the partition wall 20 has the shape that the upper partition wall 12 projects from the side walls of the lower partition wall 11 toward the pixel areas.

Figure 2C:
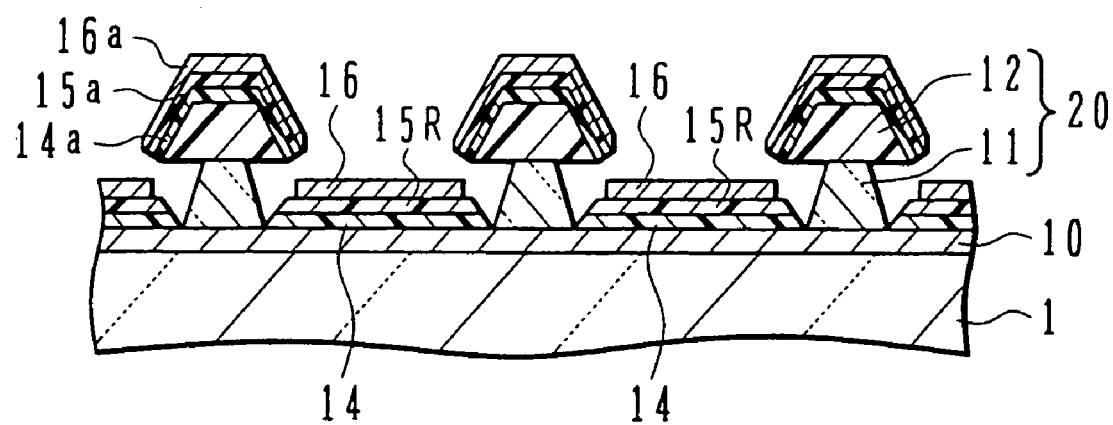
FIGS. 2C and 3A are cross sectional views of the organic EL display of the first embodiment.
Figure 4A:
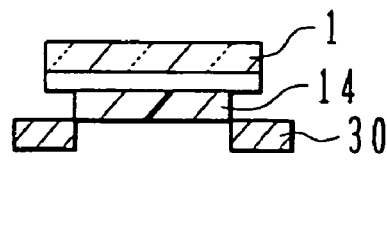
FIGS. 4A to 4G are schematic cross sectional views illustrating a vapor deposition process of forming layers from a hole transport layer to an upper electrode layer of the organic EL display of the first embodiment.

As shown in FIG. 2C, an organic compound layer is deposited on the substrate by shadow mask vapor deposition. With reference to FIG. 4A to FIG. 5, an organic compound layer deposition method will be described.

As shown in FIG. 4A, by using a shadow mask 30 having an opening corresponding to the whole display area, organic hole transport material is deposited. In the cross sectional view of FIG. 3A, a hole transport layer 14 is formed on the lower electrode 10. In the cross sectional view of FIG. 2C, the hole transport layer 14 is formed on the lower electrode 10 in the pixel area 5. Since the hole transport material also arrives in the area behind the projected portion of the upper partition wall 12, the hole transport layer 14 is deposited also below the projected portion.

Figure 4B:
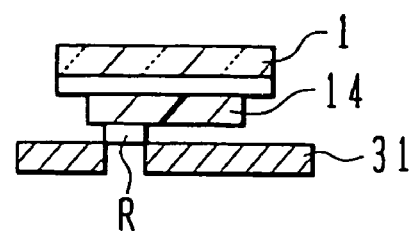
Figure 4C:
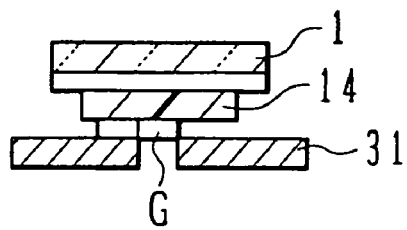
Figure 4D:
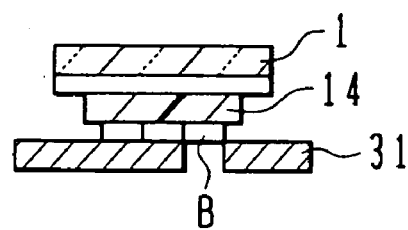
Figure 5:
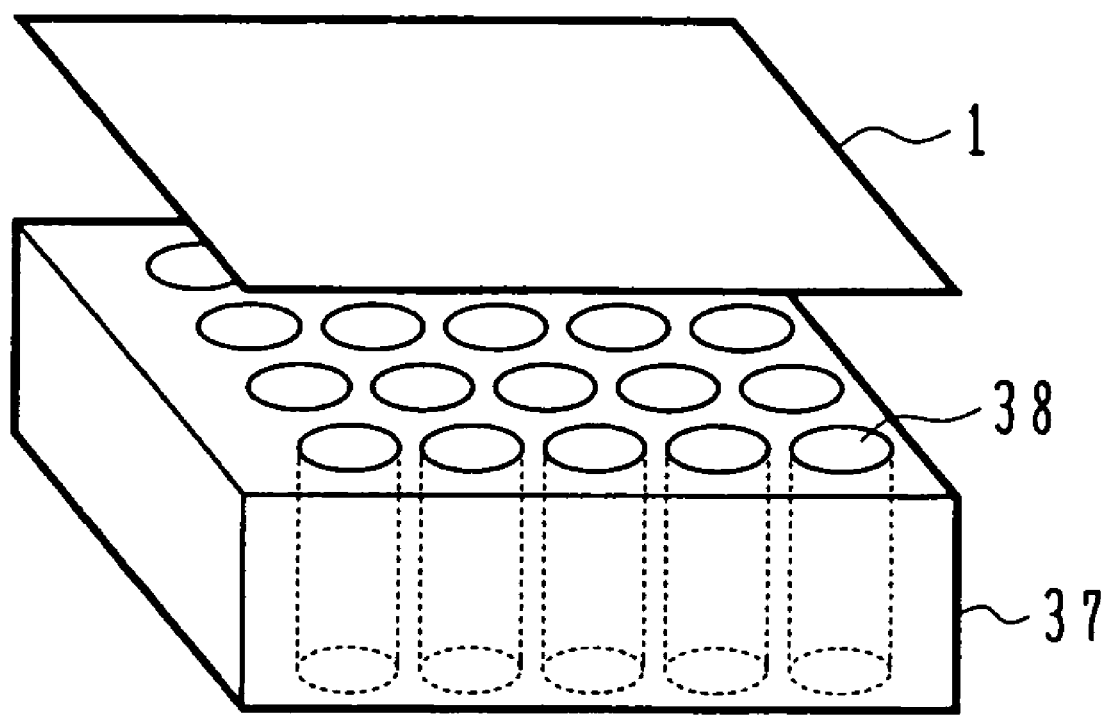
FIG. 5 is a schematic perspective view illustrating a vapor deposition process of forming the upper electrode.
Figure 5:
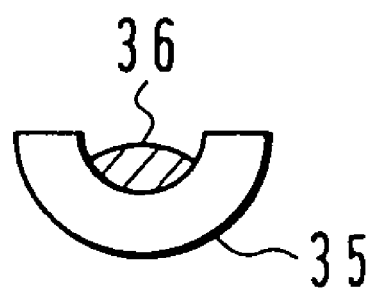

As shown in FIG. 4B, by using a shadow mask 31 having openings corresponding to the same color pixel, red organic luminescence material is deposited in red pixel areas. Next, as shown in FIG. 4C, the shadow mask 31 is shifted by one pixel amount, and green organic luminescence material is deposited in green pixel areas. As shown in FIG. 4D, the shadow mask 31 is further shifted by one pixel amount, and blue organic luminescence material is deposited in blue pixel areas.

Figure 3A:
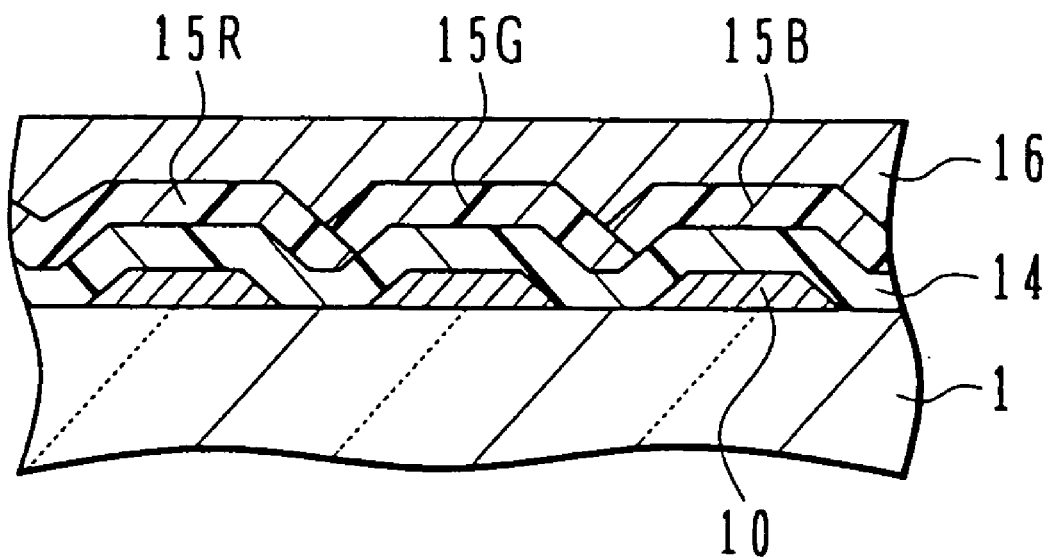

As shown in FIG. 3A, formed therefore in predetermined pixel areas are red organic luminescence layers 15R, green luminescence layers 15G and blue luminescence layers 15B. A total thickness of the hole transport layer 14 and organic luminescence layer 15 is 100 nm. For the pixels shown in the cross sectional view of FIG. 2C, the same color organic luminescence layers, e.g., red organic luminescence layers 15R, are formed. Also on the surface of the upper partition wall 12, hole transport material and organic luminescence material are deposited and organic compound layers 14a and 15a are formed.

Figure 4E:
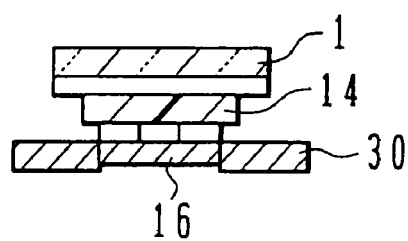

As shown in FIG. 4E, by using the shadow mask 30 having an opening corresponding to the whole display area, Al—Li alloy is deposited on the organic luminescence layers 15R, 15G and 15B to form upper electrodes 16. A thickness of the upper electrode 16 is 120 nm.

FIG. 5 is a schematic perspective view of a vapor deposition equipment to be used for forming the upper electrodes 16. Source material 36 of the upper electrodes is loaded in a crucible 35. A collimator 37 is disposed between the substrate 1 and crucible 35. The collimator 37 is a plate having some thickness and having a number of through holes 38 therethrough, the holes having the center axes parallel to the plate thickness direction. The cross section of the through hole 38 may be circular, hexagonal or other shapes.

The source material evaporated in the crucible 35 and flying in the direction largely inclined from the normal to the substrate 1 cannot pass through the through hole 38 and will not reach the substrate 1. The source material flying in the direction generally parallel to the normal to the substrate 1 passes through the through hole 38 and reaches the substrate 1. Therefore, as shown in FIG. 2C, the upper electrode material hardly arrives in the area behind the protruded portion of the upper partition wall 12. The amount of the upper electrode material arriving in the area is less than that of hole transport material and organic luminescence material. The upper electrode 16 is therefore not formed on the organic luminescence layer 15R near its border. The upper electrode material is also deposited on the partition wall 20 and a conductive layer 16a is formed.

For example, assuming that a thickness of the collimator 37 is 60 mm and a diameter of the through hole 38 is 5 mm, the source material flying in the direction inclined by 4.8° or larger from the normal to the substrate will not reach the substrate 1. By setting the maximum angle between the substrate normal direction and the flying direction of source material of the organic luminescence layers 15R, 15G and 15B, larger than 4.8°, the amount of organic luminescence material arriving in the area behind the protruded portion can be set larger than that of the upper electrode material. For example, if the collimator 37 is dismounted and an evaporation source is placed covering a broad area, the amount of material arriving in the area behind the protruded portion can be set large for all pixels.

In order to obtain the equal deposition conditions for all pixels of the substrate 1, it is preferable to dispose a plurality of crucibles 35 shown in FIG. 5 on a virtual plane parallel to the substrate 1. The uniformity of film thicknesses can be improved further by rotating the substrate 1 during deposition.

Figure 4F:
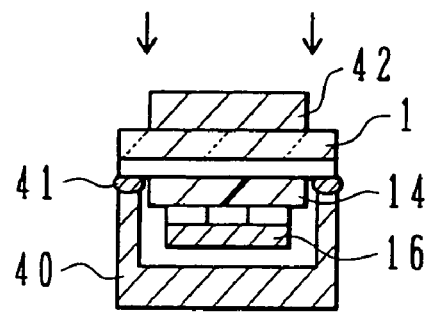

As shown in FIG. 4F, the substrate 1 is placed in a vacuum chamber, and a sealing member 40 is cupped on the substrate 1 at the plane where the organic luminescence layer is formed. The substrate 1 and sealing member 40 are adhered with ultraviolet cure adhesive. When an ultraviolet ray is irradiated, the ultraviolet ray is shielded with a light shielding plate 42 in order not to apply it to the organic hole transport layer and organic luminescence layer.

Figure 4G:
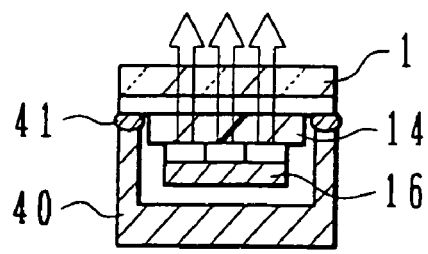

As shown in FIG. 4G, an organic EL display can be obtained, in which light emitted from the organic luminescence layer passes through the substrate 1 and irradiated to the external.

In the first embodiment described above, as shown in FIG. 2C, the upper electrode 16 is not formed in a thin region near the border of the organic hole transport layer 14 and organic luminescence layer 15R. Current can therefore be flowed uniformly through the organic luminescence layer 15R.

Also in the first embodiment, the upper partition wall 12 made of photosensitive resin shown in FIG. 2A can be subjected to heat treatment at a high temperature, while the shape of the upper partition wall 12 is maintained. It is therefore possible to sufficiently desorb organic solvent and adsorbed gas. It is therefore possible to prevent deterioration of the organic EL display to be caused by gas desorbed from organic material.

Figure 3B:
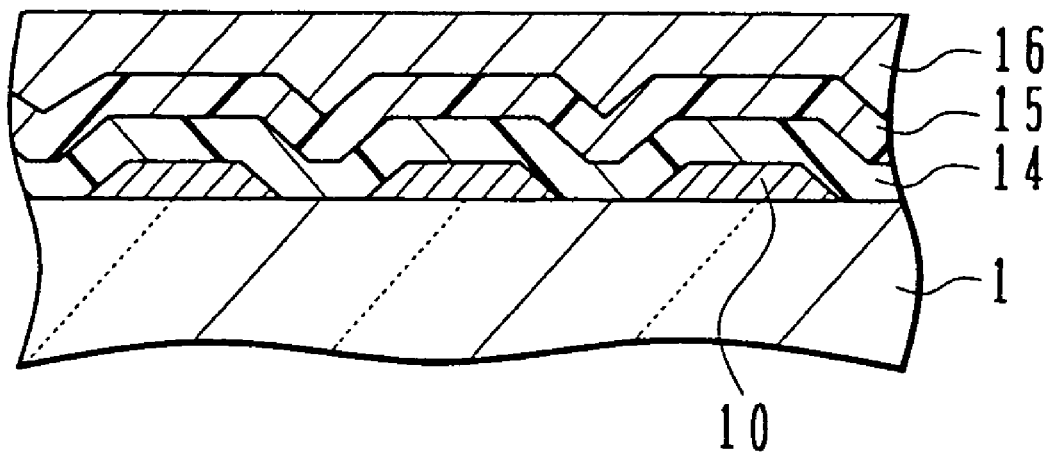
FIG. 3B is a cross sectional view of an organic EL display according to a modification of the first embodiment.

FIG. 3B is a cross sectional view of an organic EL display according to a modification of the first embodiment. In the first embodiment, RGB pixels are disposed along the cross sectional direction in FIG. 3A (column direction in FIG. 1). In the modification shown in FIG. 3B, RGB pixels are disposed in the row direction in FIG. 1. Therefore, pixels of the same color appear in the cross sectional view of FIG. 3B. One organic luminescence layer 15 extends in the lateral direction in FIG. 3B.

Figure 6A:
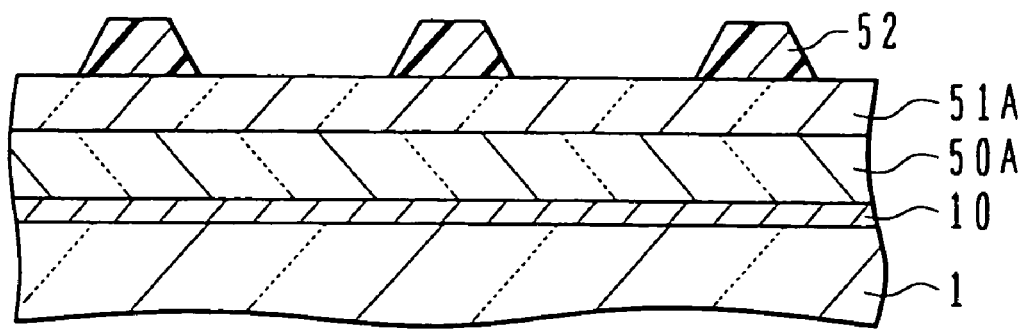
FIGS. 6A and 6B are cross sectional views of a substrate illustrating a method of manufacturing an organic EL display according to a second embodiment.
Figure 6B:
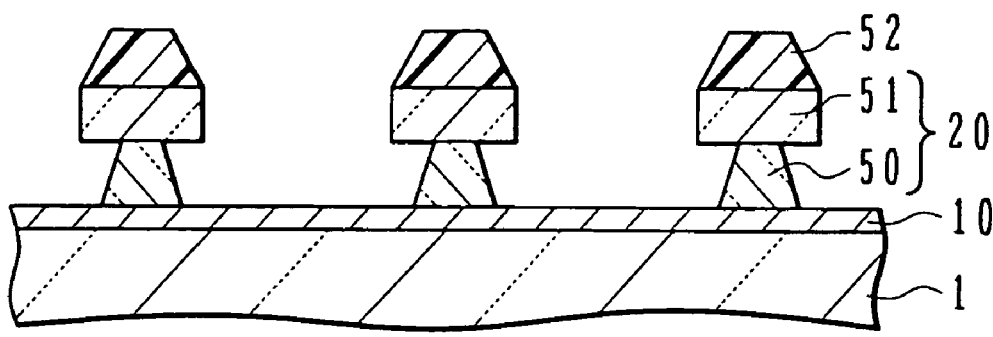
Figure 6C:
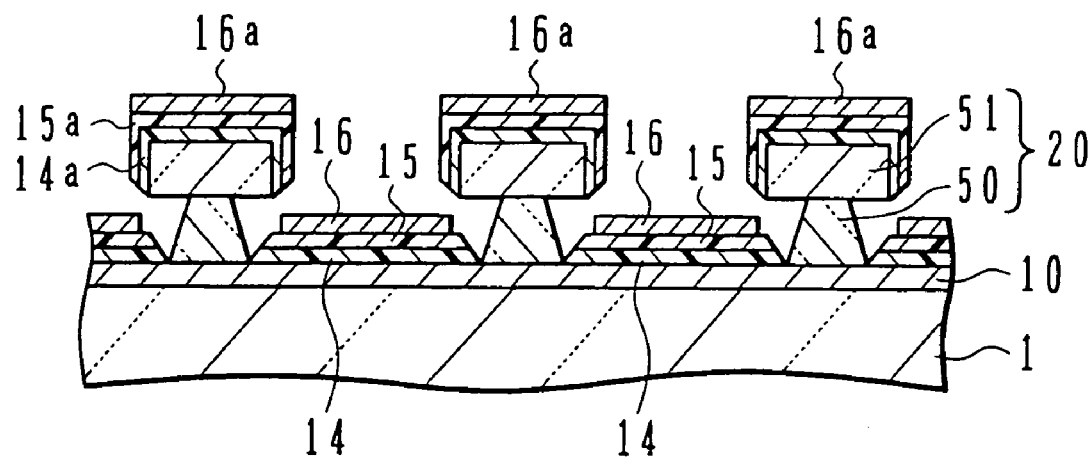
FIG. 6C is a cross sectional view of an organic EL display according to the second embodiment.

Next, with reference to FIGS. 6A to 6C, an organic EL display according to the second embodiment will be described. A plan view of the organic EL display of the second embodiment is the same as that of the organic EL display of the first embodiment shown in FIG. 1. FIGS. 6A to 6C correspond to the cross sectional view taken along one-dot chain line A2—A2 shown in FIG. 1.

As shown in FIG. 6A, lower electrodes 10 are formed on a glass substrate 1. The lower electrode 10 has the same structure as that of the lower electrode 10 of the first embodiment shown in FIGS. 1 and 2A. A silicon nitride film 50A of 400 nm in thickness and a silicon oxide film 51A of 300 nm in thickness are sequentially deposited on the substrate 1 by PECVD, covering the lower electrodes 10. A resist pattern 52 is formed on the silicon oxide film 51A. The resist pattern 52 is disposed at positions corresponding to the partition walls 20 shown in FIG. 1. After the resist pattern 52 is formed, post baking is executed.

By introducing mixture gas of $CHF_3$ and $H_2$ ($CHF_3$ density 10%) into a parallel plate type reactive ion etcher, the silicon oxide film 51A is anisotropically etched by using the resist pattern 52 as an etching mask.

As shown in FIG. 6B, upper partition walls 51 of silicon oxide are therefore left under the resist pattern 52. Next, by introducing mixture gas of $CF_4$ and $O_2$ ($O_2$ density 10%) into a barrel type plasma etcher, the silicon nitride film 50A is isotropically etched by using the resist pattern 52 and upper partition walls 51 as an etching mask. Lower partition walls 50 of silicon nitride are therefore left. Since the silicon nitride film 50A is etched also in the lateral direction, a partition wall 20 can be obtained having the shape that the upper partition wall 51 protrudes from the side walls of the lower partition wall 50. As shown in FIG. 3A of the first embodiment, a portion of the silicon nitride film 50A (the silicon nitride film 11A in FIG. 2A) is left in the area where the lower electrode 10 is not disposed. After the silicon nitride film 50A is etched, the resist pattern 52 is removed.

After the resist pattern 52 is removed, heat treatment is performed. This heat treatment is performed at such a temperature as moisture and the like adsorbed to the substrate surface can be removed.

As shown in FIG. 6C, hole transport layers 14, organic luminescence layers 15 and upper electrodes 16 are formed on the pixel areas. These layers are formed by the same method as that of the first embodiment. Also deposited on the partition wall 20 are a layer 14a made of hole transport material, a layer 15a made of organic luminescence material and a layer 16a made of upper electrode material.

In the second embodiment, the partition wall 20 is made of inorganic material. It is therefore possible to prevent deterioration of an organic EL device to be caused by desorption of organic solvent and adsorbed substance.

In the second embodiment, the lower partition wall 50 is made of silicon nitride and the upper partition wall 51 is made of silicon oxide. Both may be made of inorganic insulating materials having different etching characteristics. The lower partition wall 50 can be formed by etching the lower layer by using the upper partition wall 51 as an etching mask.

Also in the second embodiment, the lower partition wall 50 and upper partition wall 51 are made of different inorganic insulating materials. They may be made of inorganic compound materials having the same constituent elements and different composition ratio. For example, the lower partition wall 50 and upper partition wall 51 both may be made of silicon nitride by changing the composition ratio of silicon and nitrogen between the lower partition wall 50 and upper partition wall 51.

For example, Si:N of the lower partition wall 50 is set to 1:1, and Si:N of the upper partition wall 51 is set to 1.2:1. If etching is performed by using hydrofluoric acid having concentration of 1%, as the composition ratio of N is increased, the etching rate is raised. Therefore, etching can be performed under the condition that an etching rate of the lower partition wall 50 is faster than that of the upper partition wall 51.

The partition wall 20 may be formed not by stacking two layers having different composition ratio but by etching an inorganic compound layer having a gradually changing composition ratio in the height direction. For example, the partition wall 20 may be made of silicon nitride by making the nitrogen composition ratio smaller as the position becomes farther from the substrate 1. In etching this silicon nitride layer with hydrofluoric acid, the etching rate of the layer nearer to the substrate is faster than that of the layer farther from the substrate so that the partition wall 20 can be formed having the cross sectional shape gradually increasing the width as the position becomes higher. In this case, it is preferable to perform first anisotropic etching and then isotropic etching.

The composition ratio of a silicon nitride film can be controlled by adjusting partial pressures of source gasses, e.g., partial pressures of silane and ammonia. For example, in the case that a silicon nitride film is deposited by PECVD under the condition that a substrate temperature is 320° C., a gas pressure is 13.3 Pa (0.1 Torr), and an RF power at a frequency of 13.56 MHz for plasma generation is 0.1 W/cm$^2$, if the partial pressure ratio of silane to ammonia is set to 1:2, the Si:N composition ratio of formed silicon nitride becomes 1.2:1, whereas if the partial pressure ratio of silane to ammonia is set to 1:3, the Si:N composition ratio of formed silicon nitride becomes 1:1. By gradually changing the partial pressure ratio during film forming, a silicon nitride film can be formed whose composition ratio gradually changes in a thickness direction.

Next, with reference to FIGS. 7 to 9, description will be made on an organic EL display according to the third embodiment.

Figure 7:
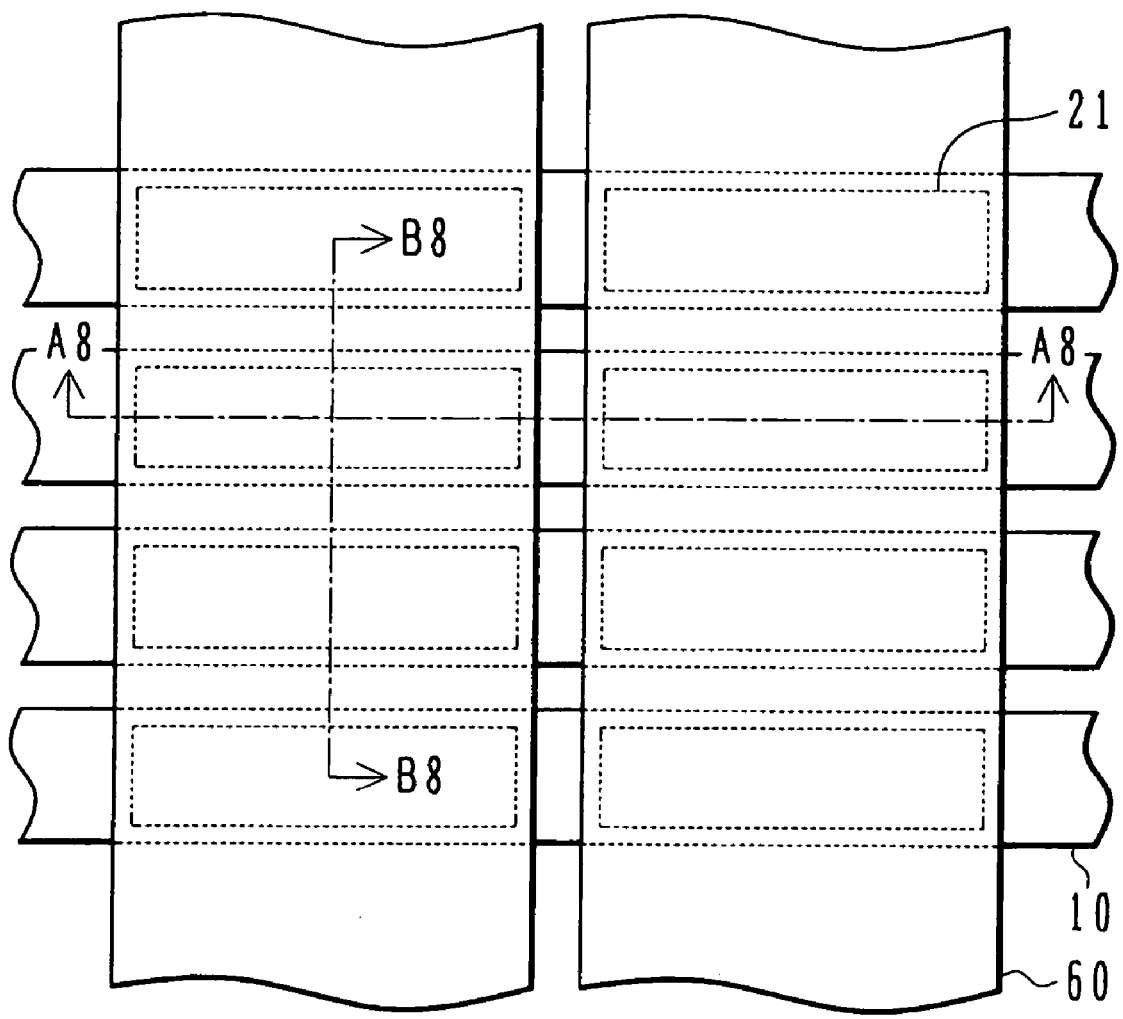
FIG. 7 is a schematic cross sectional view of an organic EL display according to a third embodiment.

FIG. 7 is a schematic plan view of the organic EL display of the third embodiment. A plurality of lower electrodes 10 extending in the row direction are formed on the surface of a substrate. In the first embodiment, the partition wall 20 extends in the column direction as shown in FIG. 1. In the third embodiment, partition walls are disposed in a lattice shape. A portion of the partition wall extending in the row direction is disposed between adjacent two lower electrodes 10. An opening area 21 of the partition walls is disposed in an area superposing the lower electrode 10. The opening areas 21 are disposed in a matrix shape and each corresponds to one pixel area.

In correspondence with each column of the opening areas 21, an upper electrode 60 extending in the column direction is disposed. Each upper electrode 60 has a width broader than the size of the opening area 21 in the row direction, and includes the opening areas 21 therein.

Figure 8A:
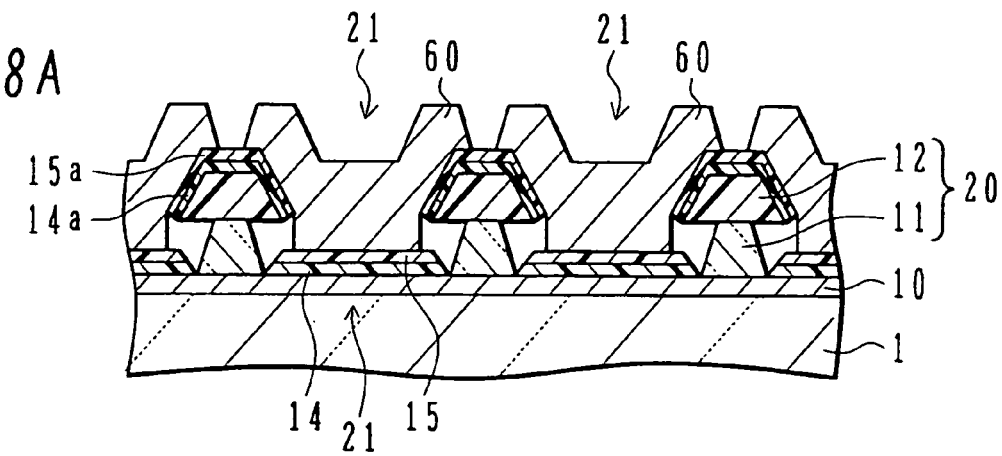
FIGS. 8A and 8B are cross sectional views of the organic EL display according to the third embodiment.

FIG. 8A is a cross sectional view taken along one-dot chain line A8—A8 of FIG. 7. The lower electrode 10 is formed on a glass substrate 1. The partition wall 20 is also formed constituted of a lower partition wall 11 and an upper partition wall 12. The cross sectional structure of the partition wall 20 is the same as that of the partition wall 20 of the first embodiment shown in FIG. 2B.

On the lower electrode 10 in the opening area 21, a hole transport layer 14 and an organic luminescence layer 15 are formed. Also deposited on the partition wall 20 are a layer 14a made of hole transport material and a layer 15a made of organic luminescence material. An upper electrode 60 is formed on the organic luminescence layer 15. The upper electrode 60 overrides the partition walls 20 on both sides of the electrode.

Figure 8B:
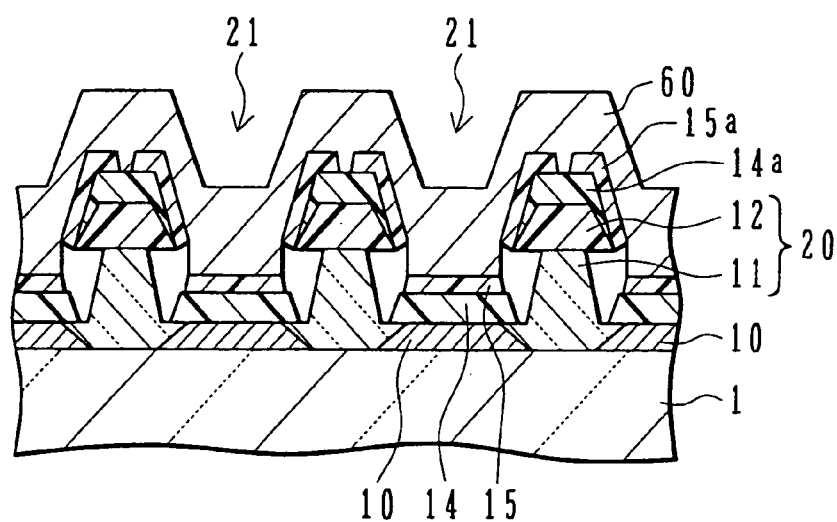

FIG. 8B is a cross sectional view taken along one-dot chain line B8—B8 of FIG. 7. RGB pixels are juxtaposed in the lateral direction in FIG. 8B. The upper electrode 60 extends in the lateral direction in FIG. 8B over a plurality of opening areas 21.

As shown in FIGS. 8A and 8B, the substrate 1, partition walls 20 and upper electrodes 60 define a closed room of each pixel. The hole transport layer 14 and organic luminescence layer 15 are disposed in this closed room.

The processes from the process of forming the lower electrode 10 of the organic EL display of the third embodiment to the process of forming the organic luminescence layer 15 are the same as the manufacture processes for the organic EL display of the first embodiment. In the third embodiment, the upper electrode 60 is deposited thicker than the case of the first embodiment so that the upper electrode is deposited continuously from the surface of the organic luminescence layer 15 to the upper surfaces of the partition walls 20. Vapor deposition for the upper electrodes 60 is performed by using a shadow mask having openings corresponding to the pixel columns.

As shown in FIG. 8A, in some cases, the organic film 15a made of organic luminescence material is exposed in a gap between the upper electrodes 60 above the partition wall 20. By applying an ultraviolet ray to the substrate 1, the exposed organic film 15a and underlying organic film 14a are decomposed. Instead of applying an ultraviolet ray, the substrate may be exposed to an oxidizing atmosphere.

Figure 8C:
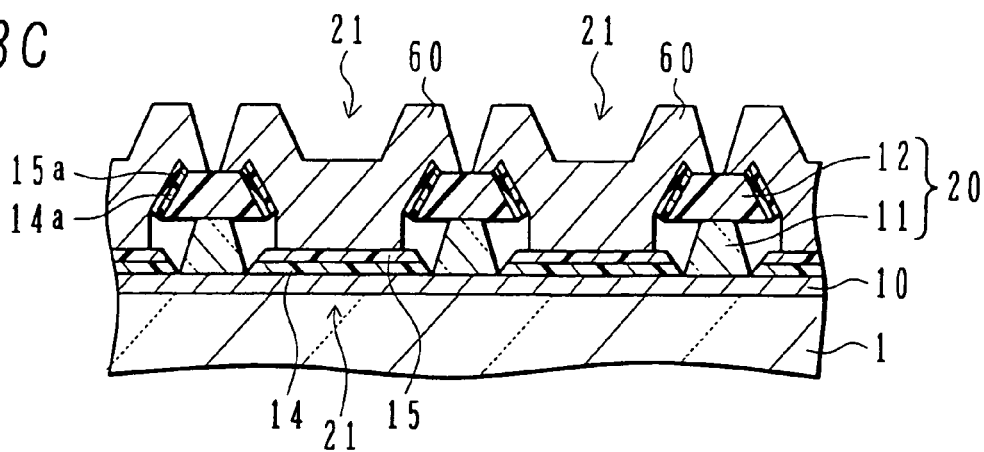
FIG. 8C is a cross sectional view of an organic EL display according to a modification of the third embodiment.

FIG. 8C is a cross sectional view of an organic EL display taken along one-dot chain line A8—A8 in which a width in the row direction of the opening of a shadow mask used for depositing the upper electrode 60 shown in FIG. 7 is made wider than a width in the row direction of the opening of a shadow mask used for depositing the organic films 14a and 15a. The organic films 14a and 15a are completely covered with the upper electrodes 60 and are not exposed. The process of decomposing the organic films 14a and 15a is therefore unnecessary.

In the third embodiment, the hole transport layer 14 and organic luminescence layer 15 are disposed in the room separated from the atmospheric air. It is therefore possible to prevent deterioration of organic compound to be caused by invasion of moisture and the like.

Figure 9A:
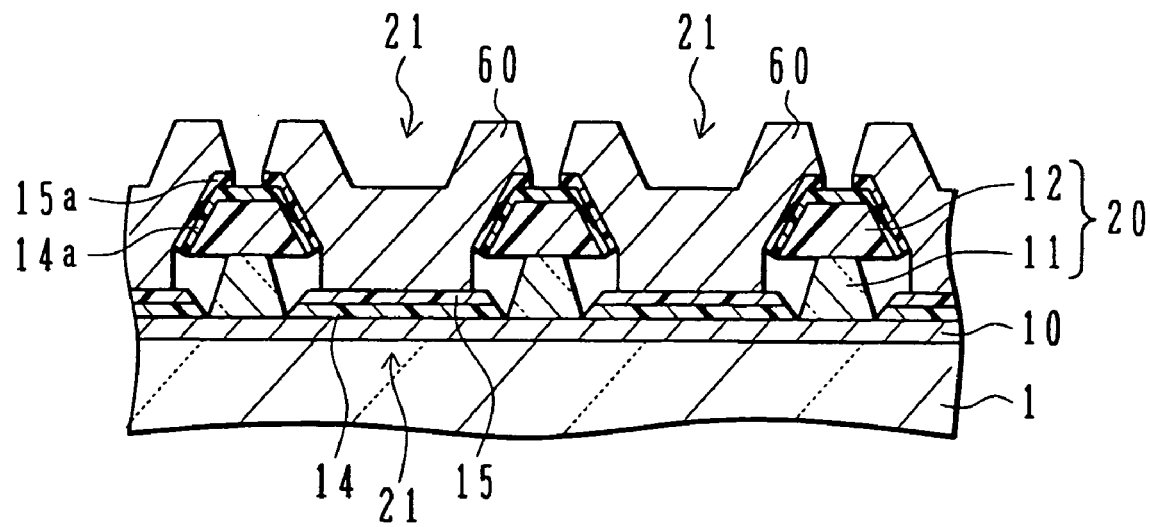
FIGS. 9A and 9B are cross sectional views of an organic EL display according to a modification of the third embodiment.
Figure 9B:
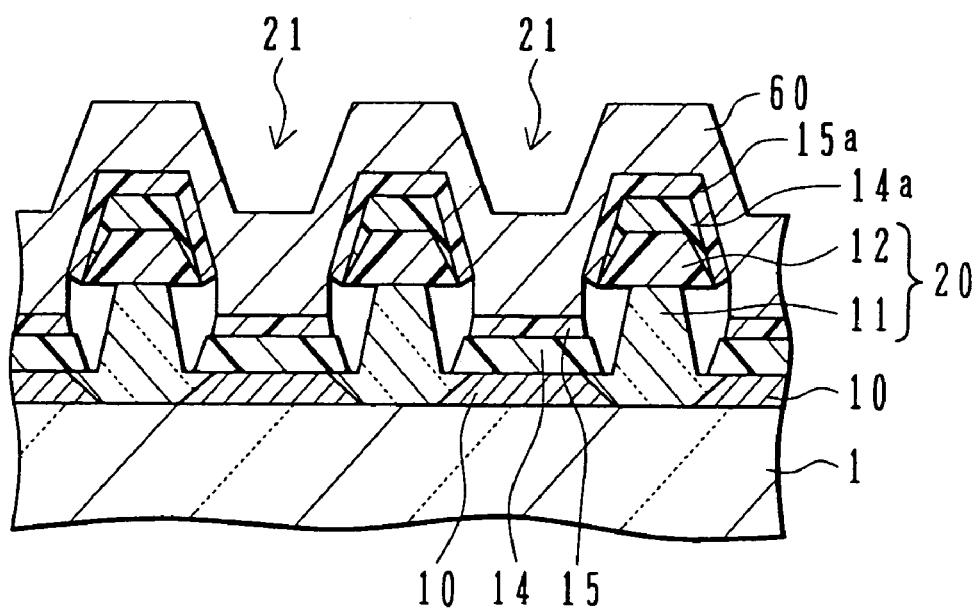

FIGS. 9A and 9B are cross sectional views of an organic EL display according to a modification of the third embodiment. FIGS. 9A and 9B correspond to cross sectional views taken along one-dot chain lines A8—A8 and B8—B8 of FIG. 7, respectively. In this modification, RGB pixels are disposed in the row direction in FIG. 7. Therefore, in the cross sectional view of FIG. 9A, an organic film 15a made of organic luminescence material is separated above a partition wall 20. In the cross sectional view of FIG. 9B, the organic film 15a is continuous above the partition wall 20.

Also in this modification, similar to the third embodiment, a closed room is defined for each pixel. It is therefore possible to prevent deterioration of organic compound to be caused by invasion of moisture.

Figure 10:
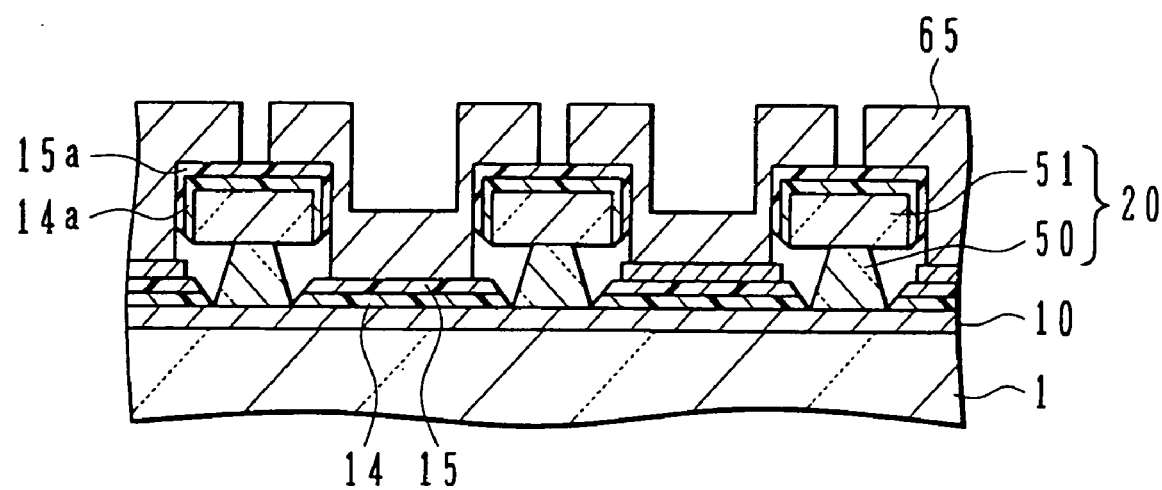
FIG. 10 is a cross sectional view of an organic EL display according to a fourth embodiment.
Figure 11:
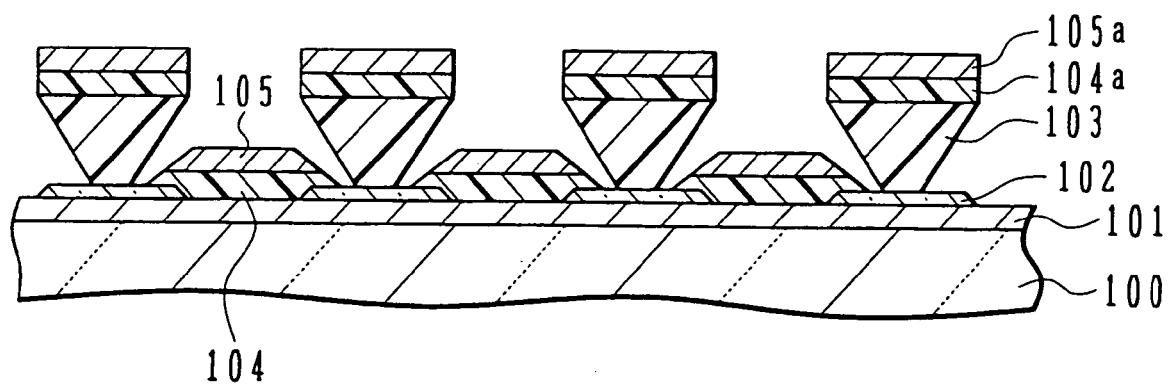
FIG. 11 is a cross sectional view of a conventional organic EL display.

FIG. 10 is a cross sectional view of an organic EL display according to the fourth embodiment. The partition walls of the organic EL display of the fourth embodiment have the same plan shape as that of the partition walls of the organic EL display of the third embodiment shown in FIG. 7. FIG. 10 corresponds to a cross sectional view taken along one-dot chain line A8—A8 of FIG. 7. The cross sectional structure of a partition wall 20 of the organic EL display of the fourth embodiment is the same as that of the partition wall 20 of the organic EL display of the second embodiment shown in FIG. 6C.

Similar to the second embodiment, a hole transport layer 14 and an organic luminescence layer 15 are stacked in the pixel area. An organic film 14a made of hole transport material and an organic film 15a made of organic luminescence material are deposited on the partition wall 20. An upper electrode 65 is formed on the organic luminescence layer 15. The upper electrode 65 is thicker than the upper electrode 16 of the second embodiment shown in FIG. 6C, and continuously covers a surface above the partition walls 20.

After the upper electrode 65 is formed, an ultraviolet ray is applied to the substrate to decompose the organic films 15a and 14a exposed in a gap between the upper electrodes 65.

In the organic EL display of the fourth embodiment, similar to the third embodiment, the hole transport layer 14 and organic luminescence layer 15 are disposed in a room defined by the substrate 1, partition walls 20 and upper electrodes 65. It is therefore possible to prevent invasion of moisture from an external.

In the first to fourth embodiments, the organic compound layer is constituted of two layers, the hole transport layer and organic luminescence layer. Other layer structures may be used as the organic compound layer. For example, a three-layer structure may be used including a hole injection layer, a hole transport layer and an organic luminescence layer. An electron transport layer may be interposed between the organic luminescence layer and upper electrode.

The present invention has been described in connection with the preferred embodiments. The invention is not limited only to the above embodiments. It will be apparent to those skilled in the art that other various modifications, improvements, combinations, and the like can be made.

What we claim are:

1. An organic EL display comprising:
a substrate with a plurality of pixel areas being defined on a surface of the substrate;
a partition wall disposed on the surface of the substrate in an area between adjacent pixel areas, the partition wall being made of inorganic compound whose composition gradually changes in a height direction, the upper portion of the partition wall protruding from side walls of the lower portion toward the pixel areas,
lower electrodes formed on the pixel areas;
organic layers disposed on the lower electrodes and containing organic luminescence material which emits light upon current injection; and
upper electrodes disposed on the organic layers.

2. An organic EL display comprising:
a substrate with a plurality of pixel areas being defined on a surface of the substrate;
a partition wall, comprised of a lower portion and an upper portion, disposed on the surface of the substrate in an area between adjacent pixel areas, the upper portion of the partition wall protruding from side walls of the lower portion toward the pixel areas;
lower electrodes formed on the pixel areas;
organic layers disposed on the lower electrodes and containing organic luminescence material which emits light upon current injection; and
upper electrodes disposed on the organic layers,
wherein edges of the upper electrodes are arranged behind edges of the organic layers, and
wherein at least one of the lower portion and the upper portion are made of inorganic material.

3. The organic EL display according to claim 2, wherein the pixel areas are disposed on the surface of the substrate in a matrix shape, the partition wall is disposed between adjacent two columns of the pixel areas and between adjacent two rows of the pixel areas, and the partition walls have a lattice pattern.

4. The organic EL display according to claim 3, wherein the lower electrode is constituted of a first conductive film extending in a row direction and disposed in correspondence with each row of the pixel areas, and the upper electrode is constituted of a second conductive film extending in a column direction and disposed in correspondence with each column of the pixel areas.

5. The organic EL display according to claim 3, wherein a width of the upper electrode is wider than an opening area between partition walls, and wherein closed rooms are defined closed by the substrate, the partition walls and the upper electrodes.

* * * * *